US011031536B2

(12) United States Patent
McBride

(10) Patent No.: US 11,031,536 B2
(45) Date of Patent: Jun. 8, 2021

(54) VEHICLE BATTERY THERMOELECTRIC DEVICE WITH INTEGRATED COLD PLATE ASSEMBLY AND METHOD OF ASSEMBLING SAME

(71) Applicant: Gentherm Incorporated, Northville, MI (US)

(72) Inventor: Shaun Peter McBride, Augsburg (DE)

(73) Assignee: Gentherm Incorporated, Northville, MI (US)

( * ) Notice: Subject to any disclaimer, the term of this patent is extended or adjusted under 35 U.S.C. 154(b) by 0 days.

(21) Appl. No.: 15/580,559

(22) PCT Filed: Jun. 8, 2016

(86) PCT No.: PCT/US2016/036451
§ 371 (c)(1),
(2) Date: Dec. 7, 2017

(87) PCT Pub. No.: WO2016/200943
PCT Pub. Date: Dec. 15, 2016

(65) Prior Publication Data
US 2018/0175271 A1     Jun. 21, 2018

Related U.S. Application Data

(60) Provisional application No. 62/173,507, filed on Jun. 10, 2015.

(51) Int. Cl.
*H01L 35/32* (2006.01)
*H01M 10/6572* (2014.01)
(Continued)

(52) U.S. Cl.
CPC .............. *H01L 35/32* (2013.01); *H01L 35/02* (2013.01); *H01M 10/625* (2015.04); *H01M 10/6572* (2015.04); *H01L 35/08* (2013.01)

(58) Field of Classification Search
CPC ......... H01L 35/32; H01L 35/30; H01L 35/08; H01L 35/34; H01M 10/6572; H01M 10/625; F25B 21/02; F25B 2321/023
(Continued)

(56) References Cited

U.S. PATENT DOCUMENTS 3,379,577 A * 4/1968 Bird, Jr. .................. H01L 35/08
136/205
3,531,330 A   9/1970 Elfving
(Continued)

FOREIGN PATENT DOCUMENTS

AT    243027     10/1965
CN    2044703    9/1989
(Continued)

OTHER PUBLICATIONS

English machine translation of JP-2008047371-A (Year: 2008).*
(Continued)

*Primary Examiner* — Andrew J Golden
(74) *Attorney, Agent, or Firm* — Carlson, Gaskey & Olds, P.C.

(57) ABSTRACT

A cooling system for thermally conditioning a component which includes a battery and a heat spreader supporting the battery. Multiple thermoelectric devices are bonded to the heat spreader, for example, using solder or braze, which provides improved heat transfer. A cold plate assembly operatively thermally engages the thermoelectric devices.

5 Claims, 3 Drawing Sheets

(51) Int. Cl.
   *H01M 10/625* (2014.01)
   *H01L 35/02* (2006.01)
   *H01L 35/08* (2006.01)
(58) Field of Classification Search
   USPC .................................................. 136/200–242
   See application file for complete search history.

(56) References Cited

U.S. PATENT DOCUMENTS

| | | | |
|---|---|---|---|
| 3,690,705 A | 9/1972 | Ygfors | |
| 4,107,934 A | 8/1978 | Beitner | |
| 4,279,292 A | 7/1981 | Swiatosz | |
| 4,314,008 A | 2/1982 | Blake | |
| 4,465,894 A | 8/1984 | Reyes | |
| 4,744,009 A | 5/1988 | Grabbe et al. | |
| 4,759,190 A | 7/1988 | Trachtenberg et al. | |
| 4,823,554 A | 4/1989 | Trachtenberg et al. | |
| 4,999,576 A * | 3/1991 | Levinson | H01M 10/6572 324/142 |
| 5,046,555 A | 9/1991 | Nguyen | |
| 5,161,089 A | 11/1992 | Chu et al. | |
| 5,181,382 A | 1/1993 | Middlebrook | |
| 5,409,547 A | 4/1995 | Wantanabe et al. | |
| 5,429,680 A * | 7/1995 | Fuschetti | H01L 35/32 136/203 |
| 5,585,204 A | 12/1996 | Oshida et al. | |
| 5,784,890 A | 7/1998 | Polkinghorne | |
| 5,809,785 A | 9/1998 | Polkinghorne | |
| 5,899,077 A | 5/1999 | Wright et al. | |
| 6,151,214 A | 11/2000 | Yeh | |
| 6,174,117 B1 | 1/2001 | Kawatani et al. | |
| 6,341,490 B1 | 1/2002 | Jones | |
| 6,532,746 B1 | 3/2003 | Bloom et al. | |
| 6,749,010 B2 | 6/2004 | Getz, Jr. et al. | |
| 7,207,760 B2 | 4/2007 | Junkers | |
| 8,841,015 B2 | 9/2014 | Yoon | |
| 8,871,372 B2 | 10/2014 | Eckstein et al. | |
| 8,915,091 B2 | 12/2014 | Goenka | |
| 8,974,942 B2 | 3/2015 | Bell et al. | |
| 9,797,664 B2 | 10/2017 | Wayne et al. | |
| 2002/0157698 A1* | 10/2002 | Itakura | H01L 35/32 136/205 |
| 2004/0028562 A1 | 2/2004 | Greve et al. | |
| 2004/0086780 A1 | 5/2004 | Ebermann | |
| 2005/0126184 A1 | 6/2005 | Cauchy | |
| 2005/0280140 A1 | 12/2005 | Crobin, Jr. et al. | |
| 2006/0185711 A1 | 8/2006 | Bang et al. | |
| 2007/0074446 A1 | 4/2007 | Wilcox et al. | |
| 2008/0000511 A1 | 1/2008 | Kuroyanagi et al. | |
| 2008/0041067 A1 | 2/2008 | Matsuoka et al. | |
| 2008/0053108 A1 | 3/2008 | Wen | |
| 2008/0117598 A1 | 5/2008 | Hsu et al. | |
| 2008/0268333 A1 | 10/2008 | Barrella et al. | |
| 2009/0284230 A1* | 11/2009 | Goma | H01M 10/6572 320/152 |
| 2009/0301541 A1 | 12/2009 | Watts | |
| 2010/0101620 A1* | 4/2010 | Tanaka | H01L 35/08 136/205 |
| 2010/0108117 A1 | 5/2010 | Hamano et al. | |
| 2010/0242486 A1 | 9/2010 | Jarmon et al. | |
| 2010/0243346 A1* | 9/2010 | Anderson | H01M 10/6572 180/65.21 |
| 2010/0300504 A1 | 12/2010 | Ceron Parisi et al. | |
| 2011/0108080 A1 | 5/2011 | Kwok et al. | |
| 2011/0189523 A1 | 8/2011 | Eom | |
| 2011/0244300 A1 | 10/2011 | Closek et al. | |
| 2013/0000285 A1 | 1/2013 | Prior | |
| 2013/0074431 A1 | 3/2013 | Croasdale | |
| 2013/0207617 A1 | 8/2013 | Houchin-Miller et al. | |
| 2013/0213448 A1* | 8/2013 | Moczygemba | H01L 35/32 136/201 |
| 2013/0213449 A1 | 8/2013 | Parish et al. | |
| 2013/0291921 A1 | 11/2013 | Morita et al. | |
| 2014/0013774 A1 | 1/2014 | Grünwald et al. | |
| 2014/0096808 A1 | 4/2014 | Moczygemba | |
| 2014/0224466 A1 | 8/2014 | Lin et al. | |
| 2014/0338366 A1 | 11/2014 | Adldinger et al. | |
| 2015/0116943 A1 | 4/2015 | Olsson | |
| 2015/0340746 A1 | 11/2015 | Origuchi et al. | |
| 2016/0181835 A1* | 6/2016 | Gross | H01M 10/6572 320/101 |
| 2016/0240903 A1 | 8/2016 | Kossakovski et al. | |
| 2017/0005249 A1 | 1/2017 | McBride | |

FOREIGN PATENT DOCUMENTS

| | | | |
|---|---|---|---|
| CN | 2735256 | 10/2005 | |
| CN | 2830989 Y | 10/2006 | |
| CN | 1996631 A | 7/2007 | |
| CN | 101086269 A | 12/2007 | |
| CN | 101652020 A | 2/2010 | |
| CN | 201562577 U | 8/2010 | |
| CN | 201746943 U | 2/2011 | |
| CN | 202414091 U | 9/2012 | |
| CN | 103993904 A | 8/2014 | |
| DE | 1126426 | 3/1962 | |
| DE | 19654947 | 8/1998 | |
| DE | 10003740 | 6/2001 | |
| DE | 10196995 B4 | 10/2005 | |
| DE | 202005015190 | 1/2006 | |
| DE | 102006020503 A1 | 10/2007 | |
| DE | 102007011026 | 9/2008 | |
| DE | 202010010841 | 11/2011 | |
| DE | 202013001662 | 5/2013 | |
| DE | 102012206127 | 10/2013 | |
| EP | 0368741 | 5/1990 | |
| EP | 0678917 | 10/1995 | |
| EP | 1220313 | 7/2002 | |
| EP | 2362457 | 8/2011 | |
| EP | 2363881 A1 | 9/2011 | |
| GB | 2039387 | 8/1980 | |
| JP | H04273484 A | 9/1992 | |
| JP | H04360955 | 12/1992 | |
| JP | H06207762 | 7/1994 | |
| JP | H06294561 A | 10/1994 | |
| JP | H1030856 | 3/1998 | |
| JP | H10266378 | 10/1998 | |
| JP | 11-274574 A | 10/1999 | |
| JP | 2000058930 | 2/2000 | |
| JP | 2003318455 A | 11/2003 | |
| JP | 2006024608 | 1/2006 | |
| JP | 2008047371 A * | 2/2008 | B60L 58/21 |
| JP | 2008270618 A | 11/2008 | |
| JP | 2009295612 A | 12/2009 | |
| JP | 2010021410 A | 1/2010 | |
| JP | 2010192207 | 9/2010 | |
| JP | 2011211079 A | 10/2011 | |
| JP | 2012204450 A | 10/2012 | |
| JP | 2003149524 | 8/2013 | |
| WO | 02086980 A1 | 10/2002 | |
| WO | 2004054007 | 6/2004 | |
| WO | 2007033663 A1 | 3/2007 | |
| WO | 2008150066 A1 | 12/2008 | |
| WO | 2011035991 | 3/2011 | |
| WO | WO-2011138156 A1 * | 11/2011 | H01M 10/6572 |
| WO | 2013050961 | 4/2013 | |
| WO | 03071198 A1 | 8/2013 | |
| WO | 2013186020 A1 | 12/2013 | |
| WO | 2014021841 | 2/2014 | |
| WO | 2015039185 A1 | 3/2015 | |
| WO | 2015066079 | 5/2015 | |

OTHER PUBLICATIONS

English machine translation of WO-2011138156-A1 (Year: 2011).*
Japanese Rejection for Japanese Application No. 2017-564468 dated Dec. 28, 2018.
Korean Rejection for Korean Application No. 10-2017-7036850 dated Feb. 1, 2019.
International Preliminary Report on Patentability for PCT/US2016/036451 dated Dec. 21, 2017.

(56) References Cited

OTHER PUBLICATIONS

Korean Rejection for Korean Application No. 10-2017-7036852 dated Feb. 8, 2019.
The Japan Institute of Electronics Packaging, 7.3.5 Manual of Lead-Free Technology and Printed Circuit Technology, Nikkan Kogyo Shinbun, Ltd., Japan, May 30, 2006,Third Edition, pp. 1402 to 1406.
International Preliminary Report on Patentability for PCT/US2016/036390 dated Dec. 21, 2017.
International Search Report and Written Opinion for PCT/US2016/036390 dated Jan. 12, 2017.
International Search Report and Written Opinion for PCT/US2016/036400 dated Sep. 22, 2016.
International Preliminary Report on Patentability for PCT/US2016/036400 dated Dec. 21, 2017.
International Search Report and Written Opinion for PCT/US2016/036406 dated Sep. 22, 2016.
International Preliminary Report on Patentability for PCT/US2016/036406 dated Dec. 21, 2017.
International Search Report and Written Opinion for PCT/US2016/036437 dated Sep. 14, 2016.
International Preliminary Report on Patentability for PCT/US2016/036437 dated Dec. 21, 2017.
International Search Report and Written Opinion for PCT/US2016/036444 dated Sep. 14, 2016.
International Preliminary Report on Patentability for PCT/US2016/036444 dated Dec. 21, 2017.
International Search Report and Written Opinion for PCT/US2016/036451 dated Sep. 14, 2016.
German Office Action for German Application No. 112016002619.6 dated Jan. 8, 2020.
Chinese Office Action for Chinese Application No. 201680033111.X dated Oct. 22, 2019.
Chinese Office Action for Chinese Application No. 201680033114.3 dated Nov. 12, 2019.
Chinese Office Action for Chinese Application No. 201680033076.1 dated Oct. 22, 2019.
German Office Action for German Application No. 112016002611.0 dated Dec. 13, 2019.
German Office Action for German Application No. 112016002621.8 dated Dec. 12, 2019.

\* cited by examiner

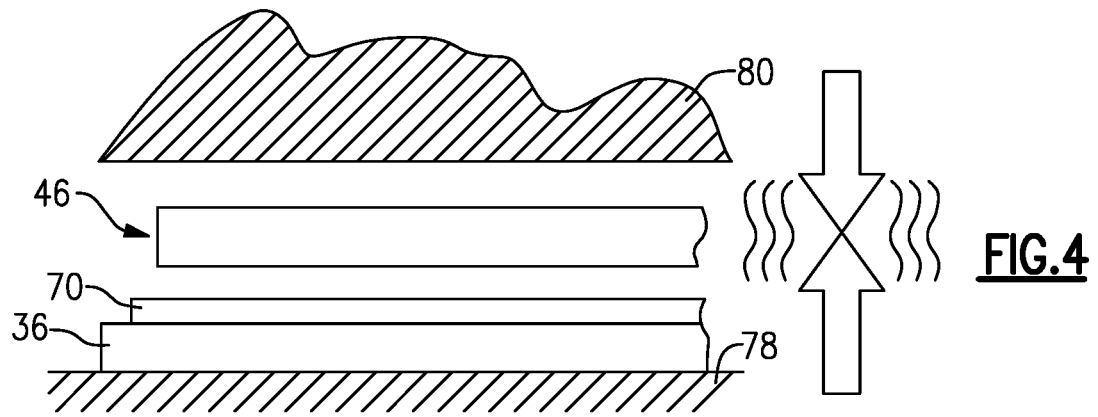
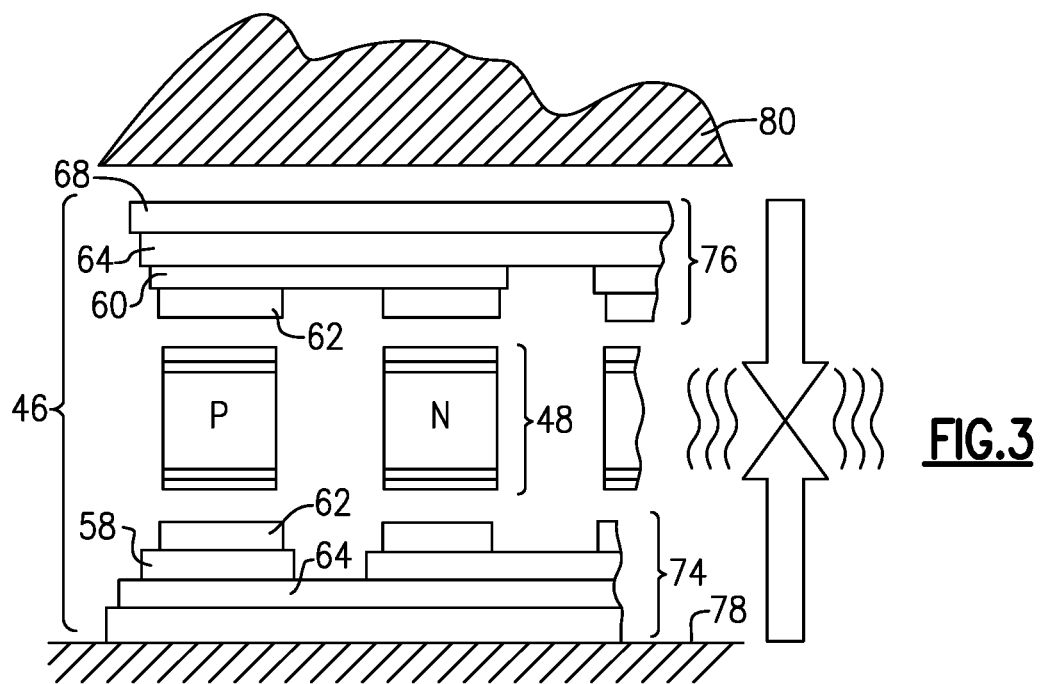

VEHICLE BATTERY THERMOELECTRIC DEVICE WITH INTEGRATED COLD PLATE ASSEMBLY AND METHOD OF ASSEMBLING SAME

CROSS-REFERENCE TO RELATED APPLICATIONS

This application claims priority to U.S. Provisional Application No. 62/173,507, which was filed on Jun. 10, 2015 and is incorporated herein by reference.

BACKGROUND

This disclosure relates to a module used to cool a vehicle component, such as a battery. In particular, the disclosure relates to an integrated thermoelectric device and cold plate assembly that provides the module and a method of assembling the same.

Lithium ion batteries are used in passenger and other types of vehicles to provide power to electric motors that provide propulsion to the vehicle. Such batteries can generate a significant amount of heat such that the battery must be cooled to prevent performance degradation.

One type of vehicle battery cooling arrangement that has been proposed that includes a thermoelectric module arranged in proximity to the battery and adjacent to a cold plate assembly. The thermoelectric module includes thermoelectric devices that operate based upon the Peltier effect to provide cooling adjacent to the battery. Heat transferred through the thermoelectric device is rejected to the cold plate assembly, which may have a cooling fluid circulated therethrough and sent to a heat exchanger.

It is desirable to design the cooling arrangement so as to efficiently transfer heat through some components within the cooling arrangement while insulating other components within the cooling arrangement.

SUMMARY

In one exemplary embodiment, a cooling system for thermally conditioning a component which includes a battery and a heat spreader supporting the battery. Multiple thermoelectric devices are bonded to the heat spreader. A cold plate assembly operatively thermally engages the thermoelectric devices.

In a further embodiment of the above, the cold plate assembly is secured to the thermoelectric devices.

In a further embodiment of any of the above, a thermal foil secures the cold plate assembly to the thermoelectric devices.

In a further embodiment of any of the above, the multiple thermoelectric devices include p-n materials that are secured to cold and hot side substrates by a first solder having a first melting point. The thermoelectric devices are secured to the heat spreader by a second solder having a second melting point that is less than the first melting point.

In a further embodiment of any of the above, a cold side plate is secured to the cold side substrate by an epoxy.

In a further embodiment of any of the above, a hot side plate is secured to the hot side substrate by an epoxy.

In a further embodiment of any of the above, the p-n materials are secured to cold and hot pads by the first solder. The cold and hot pads respectively secured to the cold and hot side substrates by the first solder.

In a further embodiment of any of the above, the first melting point is in a range of 200° C.-260° C., and the second melting point is in a range of 110° C.-160° C.

In a further embodiment of any of the above, the multiple thermoelectric devices include p-n materials that are secured to the heat spreader by an epoxy.

In a further embodiment of any of the above, the p-n materials are secured to cold and hot pads by a first solder.

In a further embodiment of any of the above, the p-n materials are secured to the cold plate assembly by a second solder having a second melting point that is less than the first melting point.

In a further embodiment of any of the above, the first melting point is in a range of 200° C.-260° C. The second melting point is in a range of 110° C.-160° C.

In a further embodiment of any of the above, a cooling loop that includes a heat exchanger is in fluid communication with the cold plate assembly.

In a further embodiment of any of the above, a DC/DC converter is arranged in operative thermal engagement with the cold plate assembly.

In another exemplary embodiment, a method of assembling an integrated thermoelectric device and cold plate assembly module includes the steps of bonding thermoelectric devices to a heat spreader and bonding the thermoelectric devices to a cold plate assembly.

In a further embodiment of any of the above, the method includes the step of bonding p-n materials to cold and hot side substrates with a first solder having a first melting point prior to performing the first bonding step.

In a further embodiment of any of the above, the method includes the step of bonding the cold and hot substrates respectively to cold and hot side plates. The first bonding step includes bonding the cold side plate to the heat spreader with a second solder having a second melting point less than the first melting point.

In a further embodiment of any of the above, the second bonding step includes bonding the thermoelectric devices to the cold plate assembly with a thermal foil.

In a further embodiment of any of the above, the method includes the step of bonding the hot side substrate to the thermal foil with an epoxy.

In a further embodiment of any of the above, the method includes the step of bonding the cold side substrate to the heat spreader with an epoxy.

BRIEF DESCRIPTION OF THE DRAWINGS

The disclosure can be further understood by reference to the following detailed description when considered in connection with the accompanying drawings wherein:

FIG. 3 illustrates a step in assembling the integrated thermoelectric device and cold plate assembly module shown in FIG. 2.

FIG. 4 illustrates another step in assembling integrated thermoelectric device and cold plate assembly module shown in FIG. 2 subsequent to the step shown in FIG. 3.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
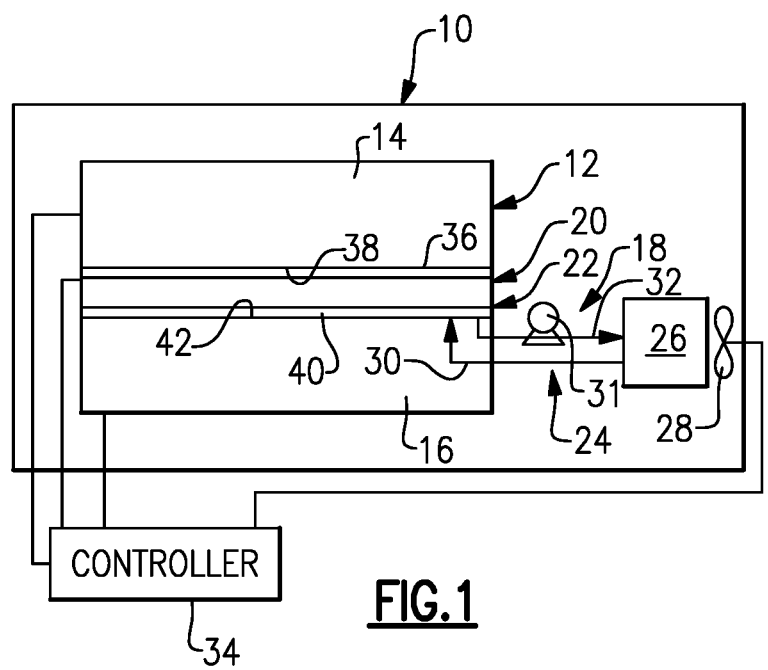
FIG. 1 is a highly schematic view of a vehicle with a vehicle system temperature regulated by a cooling system.

A vehicle 10 is schematically illustrated in FIG. 1A. The vehicle 10 includes a vehicle system 12 that either needs to be heated or cooled. In one example, the vehicle system 12 includes a battery 14, such as a lithium ion battery used for vehicle propulsion that generates a significant amount of heat. Such a battery must be cooled during operation otherwise the battery efficiency and/or integrity may degrade.

A cooling system 18 is arranged between the battery 14 and a DC/DC converter 16 in a stack to remove heat from the battery 14 thus cooling the vehicle system 12. The DC/DC converter 16 provides an electrical interface between the battery 14 and the vehicle electrics. A cooling system 18 includes an integrated thermoelectric device and cold plate assembly module 20 that is in communication with a cooling loop 24. A cooling fluid, such as glycol, is circulated by a pump 31 within the cooling loop 24. Heat is rejected to the coolant via a cold plate assembly 40 (FIG. 2) through supply and return coolant lines 30, 32 that are connected to a heat exchanger 26. A fan or blower 28 may be used to remove heat from the coolant within the heat exchanger 26 to an ambient environment, for example.

A controller 34 communicates with various components of the vehicle 10, vehicle system 12 and cooling system 18 to coordinate battery cooling. Sensors and outputs (not shown) may be connected to the controller 34.

The module 20 provides a cold side that supports a surface 38 of the battery 14. The cold plate assembly 40 provides a hot side that is in operative thermal engagement with a surface 42 of the DC/DC converter 16.

Figure 2:
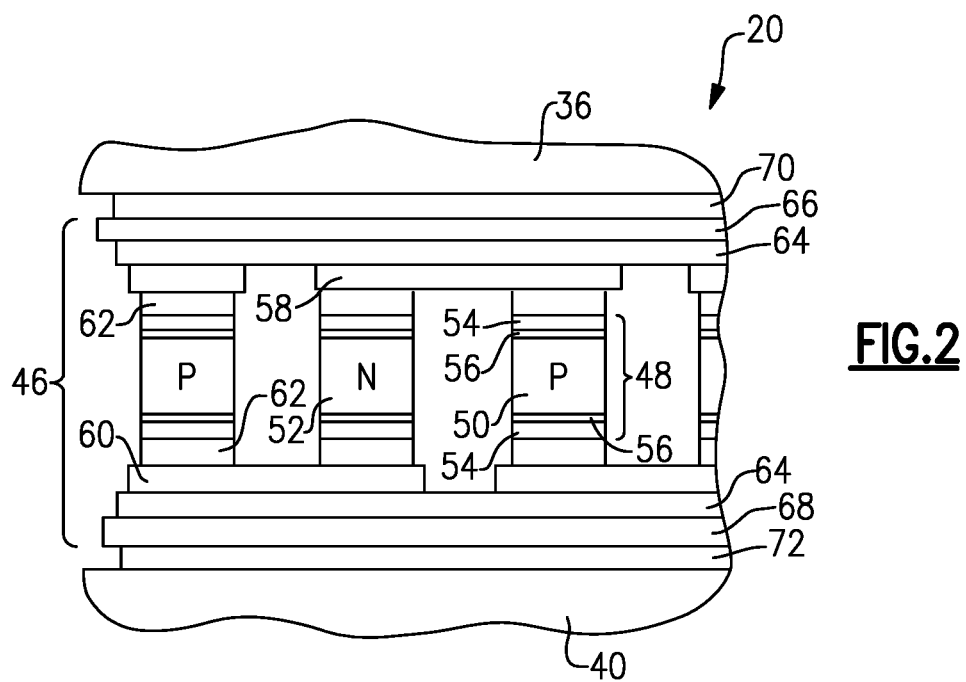
FIG. 2 is an example integrated thermoelectric device and cold plate assembly module.
Figure 5:
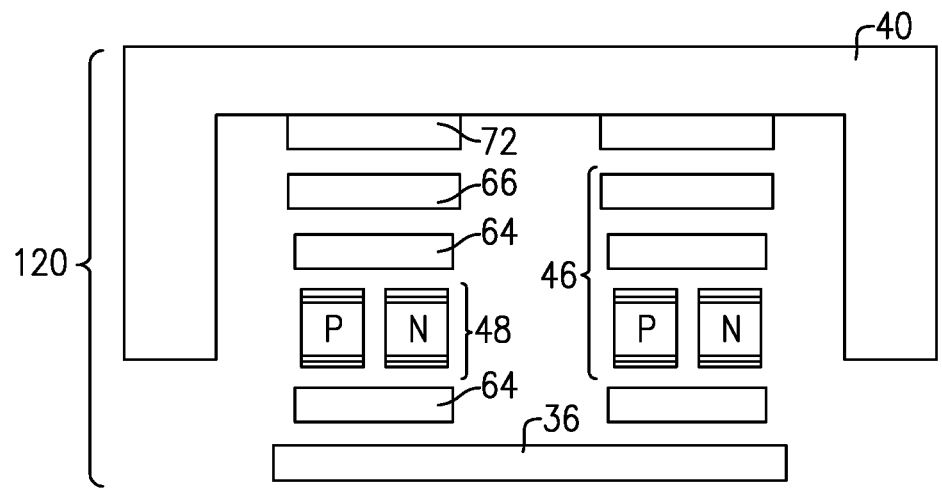
FIG. 5 illustrates a step in assembling another example integrated thermoelectric device and cold plate assembly module.

An example module 20 is shown in more detail in FIG. 2. A heat spreader 36 provides the cold side and is constructed of an aluminum or other material with a relatively high heat transfer coefficient. Multiple thermoelectric devices 46, such as Peltier devices, are bonded to and in thermal engagement with the heat spreader 36. The cold plate assembly 40 has a surface that is bonded to and in thermal engagement with the thermoelectric devices 46 on a side opposite the heat spreader 36 to provide the hot side. In this disclosure, the term "bonded" means permanently affixed by an adhesive, solder, braze or other such material as opposed to temporarily affixed, for example, by threaded fasteners.

Referring to FIG. 2, an example module 20 includes thermoelectric devices 46 that have pellets 48 of p-n materials 50, 52. The pellets 48 each include copper pads 54 secured to the p-n materials 50, 52 by solder 56 having a first melting point. The pellets 54 are secured to hot and cold side substrates 58, 60 by solder 62, which also may have the first melting point. The cold and hot side substrates 58, 60 are respectively secured to cold and hot side plates 66, 68 by an epoxy 64 that is highly thermally conductive. The cold side plate 66 is secured to the heat spreader 36 by a solder 70 having a second melting point that is less than the first melting point. In one example, the first melting point is in a range of 200° C.-260° C., and the second melting point is in a range of 110° C.-160° C. By eliminating thermal foil at the interface between the thermoelectric devices 46 and the heat spreader 36 and using a solder instead, an increase in thermal conductivity of about eight fold is achieved at the interface.

The thermal foil 72 is provided between the hot side plate 68 and the cold plate assembly 40 to take up tolerances in the stack of components. The thermal foil 72 is typically constructed from an aluminum material and has an adhesive on both sides, which secures the cold plate 40 to the hot side plate 68 to provide an integral module, in one example.

An example method of forming the module 20 illustrated in FIG. 2 is shown in FIGS. 3 and 4. In one example, a cold side assembly 74 may be provided as a subassembly. The cold side assembly 74 is supported on a first structure 78, such as a lower platen. The cold side assembly 74 includes the cold side plate 66 with the cold side substrates 58 secured thereto with the epoxy 64. The solder 62 having the first melting point may be printed onto the cold side substrate 58. The pellets 48 are then arranged on the solder 62.

A hot side assembly 76 is provided as a subassembly and includes the hot side plate 68 secured to the hot side substrate 60 by the epoxy 64. The solder 62 having the first melting point is printed on the hot side substrate.

With the cold side assembly 74, the pellets 48 and the hot side assembly 76 arranged on the first structure 78, a second structure 80, such as an upper platen, is lowered onto the assembly of thermoelectric device components, as shown in FIG. 3. With the thermoelectric device elements under pressure and heat, the solder 62 is melted to secure the assembly together. Once the thermoelectric device 46 is formed, the thermoelectric device 46 is arranged on the solder 70 supported on the heat spreader and having the second melting point, as shown in FIG. 4. These components are held under pressure and heat, which is lower than the melting point of the solder 62 so as to not reflow the solder 62 while melting the solder 70. The pressure is selected to achieve a desired clamp load on the thermoelectric devices 46 that will provide good thermal efficiency during operation.

The thermal foil 72 may be applied to the cold plate assembly 40 and thermoelectric device 46 to provide the module 20.

Figure 6:
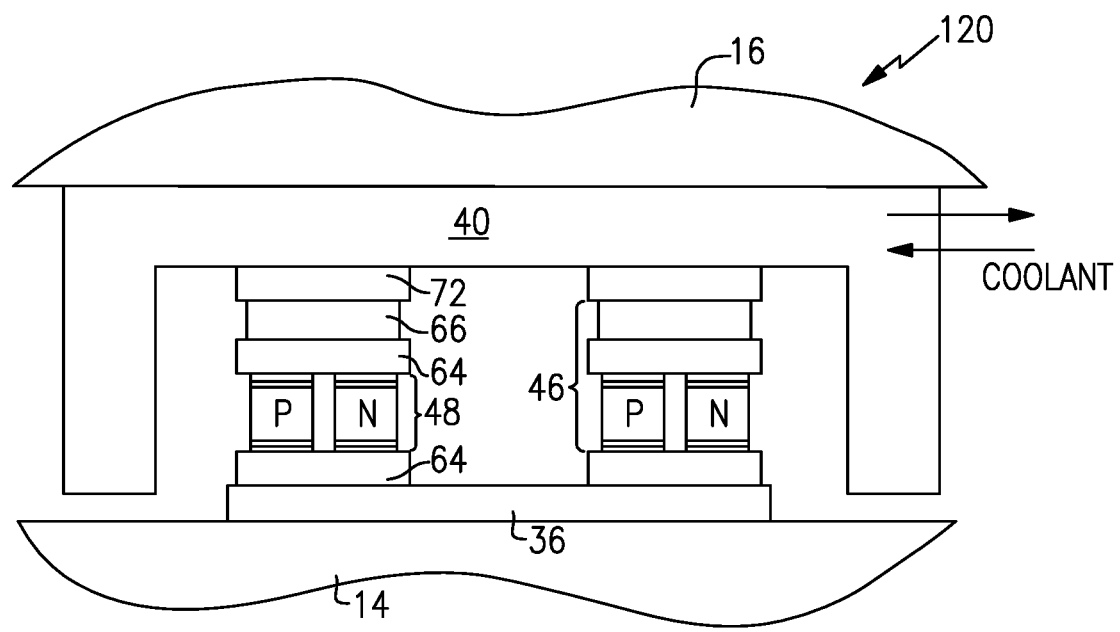
FIG. 6 is the integrated thermoelectric device and cold plate assembly module assembled according to the step shown in FIG. 5.

Another module 120 is illustrated in FIG. 6. Module 120 includes epoxy 64 securing the heat spreader 36 to the pellets 48. Another layer of epoxy 64 secures the pellets 48 to the hot side substrate 60, which is secured to the cold plate 40 using thermal foil 72. The components are held under pressure and heat in a manner similar to that described above in connection with FIGS. 3 and 4. The module 120 is arranged between the battery 14 and DC/DC converter 16, as shown in FIG. 6.

The heat spreader 36 and the cold plate assembly 40 are secured to one another in a bonded stack to provide an integrated module that provides the clamp load to the thermoelectric devices 46. By eliminated at least one layer of thermal foils, heat can be transferred more efficiently and directly to structures such as the battery 14. The modules 20, 120 also simplify assembly of the stack and reduce cost.

In operation, an undesired battery temperature is detected by the controller 34. The thermoelectric devices 46 are powered to produce a cold side of the thermoelectric device 46 that is transferred to the heat spreader 36 adjacent to the battery 14, increasing the temperature differential between these components and increasing the heat transfer therebetween. Heat from the battery 14 is transferred from the heat spreader 36 through the thermoelectric device 46 directly to the cold plate assembly 40. Heat is also rejected from the DC/DC converter 16 to the cold plate assembly 40. Coolant is circulated from the cold plate assembly 40 to the heat exchanger 26, which rejects heat to the ambient environment, and this heat transfer rate may be increased by use of the blower 28.

It should be understood that although a particular component arrangement is disclosed in the illustrated embodiment, other arrangements will benefit herefrom. Although particular step sequences are shown, described, and claimed, it also should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A cooling system for thermally conditioning a component, the cooling system comprising:
   a battery;
   a heat spreader supporting the battery;
   multiple thermoelectric devices operatively secured to the heat spreader, wherein each of the multiple thermoelectric devices include pellets consisting of p-n materials, the pellets are directly secured to and between pads by a first solder having a first melting point, wherein one pad secured directly to one side of the pellets is secured to a cold side substrate by the first solder, and another pad secured to another side of the pellets is secured directly to a hot side substrate by the first solder;
   a cold side plate is secured to the cold side substrate, the heat spreader operatively thermally engaging the thermoelectric device via the cold side plate, the cold side plate is secured to the heat spreader by a second solder having a second melting point that is less than the first melting point;
   a hot side plate is secured to the hot side substrate;
   a cold plate assembly operatively thermally engaging the thermoelectric devices via the hot side plate;
   a thermal foil securing the cold plate assembly to the hot side plate; and
   a DC/DC converter arranged in operative thermal engagement with the cold plate assembly.

2. The cooling system according to claim 1, wherein the first melting point is in a range of 200° C.-260° C., and the second melting point is in a range of 110° C.-160° C.

3. A cooling system for thermally conditioning a component, the cooling system comprising:
   a battery;
   a heat spreader supporting the battery;
   multiple thermoelectric devices operatively secured to the heat spreader, wherein each of the multiple thermoelectric devices include pellets consisting of p-n materials secured to and between pads by a solder, wherein one pad secured to one side of the pellets is secured to the heat spreader;
   a hot side substrate secured to another pad secured to another side of the pellets;
   a cold plate assembly operatively thermally engaging the hot side substrate; and
   a DC/DC converter is mounted to and in operative thermal engagement with the cold plate assembly.

4. A cooling system for thermally conditioning a component, the cooling system comprising:
   a battery;
   a heat spreader supporting the battery;
   multiple thermoelectric devices operatively secured to the heat spreader, wherein each of the multiple thermoelectric devices include pellets consisting of p-n materials, the pellets are secured to and between pads by a first solder having a first melting point, wherein one pad secured to one side of the pellets is secured to a cold side substrate by the first solder, and another pad secured to another side of the pellets is secured to a hot side substrate by the first solder;
   a cold side plate is secured to the cold side substrate, the heat spreader operatively thermally engaging the thermoelectric device via the cold side plate, wherein the cold side plate is secured to the heat spreader by a second solder having a second melting point that is less than the first melting point;
   a hot side plate is secured to the hot side substrate;
   a cold plate assembly operatively thermally engaging the thermoelectric devices via the hot side plate;
   a DC/DC converter mounted to and in thermal engagement with the cold plate assembly; and
   a cooling loop that includes a heat exchanger in fluid communication with the cold plate assembly.

5. The cooling system according to claim 4, wherein the first melting point is in a range of 200° C.-260° C., and the second melting point is in a range of 110° C.-160° C.

* * * * *